US 7,772,589 B1

(12) United States Patent
Shieh et al.

(10) Patent No.: US 7,772,589 B1
(45) Date of Patent: Aug. 10, 2010

(54) HIGH PERFORMANCE FLEXIBLE SUBSTRATE THIN FILM TRANSISTOR AND METHOD

(75) Inventors: Chan-Long Shieh, Paradise Valley, AZ (US); Gang Yu, Santa Barbara, CA (US); Hsing-Chung Lee, Calabasas, CA (US)

(73) Assignee: Cbrite Inc., Goleta, CA (US)

( * ) Notice: Subject to any disclaimer, the term of this patent is extended or adjusted under 35 U.S.C. 154(b) by 239 days.

(21) Appl. No.: 12/107,720

(22) Filed: Apr. 22, 2008

(51) Int. Cl.
*H01L 29/10* (2006.01)
(52) U.S. Cl. .................. 257/43; 257/40; 257/347; 257/E29.273; 257/E29.297; 438/151; 438/479
(58) Field of Classification Search ............... 257/43, 257/40, 347, E29.273, E29.297; 438/151, 438/479
See application file for complete search history.

(56) References Cited

U.S. PATENT DOCUMENTS

| 2004/0002176 A1* | 1/2004 | Xu ........................... 438/40 |
| 2008/0017854 A1* | 1/2008 | Marks et al. ................ 257/43 |

\* cited by examiner

*Primary Examiner*—Tu-Tu V Ho
(74) *Attorney, Agent, or Firm*—Parsons & Goltry; Robert A. Parsons; Michael W. Goltry

(57) ABSTRACT

A high performance thin film transistor includes a flexible substrate, a layer of metal oxide semiconductor material deposited on the flexible substrate, and a layer of self-assembled organic gate dielectric material deposited on the metal oxide semiconductor material. The metal oxide semiconductor material has high carrier mobility and is transparent. An interface is formed between the layer of metal oxide semiconductor material and the layer of organic gate dielectric material that is substantially free of reactions and Fermi level pinning. The polymer materials are not polar and do not give rise to gap state formation and interface scattering.

13 Claims, 1 Drawing Sheet

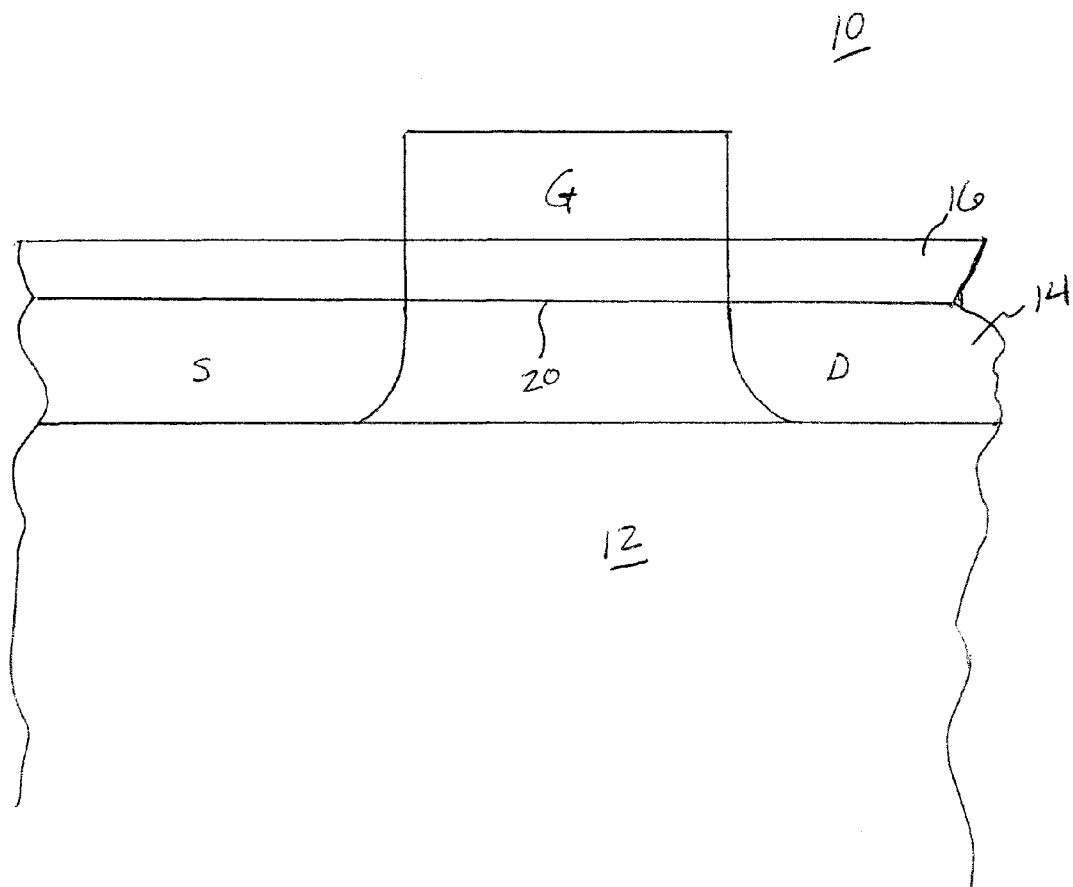

HIGH PERFORMANCE FLEXIBLE SUBSTRATE THIN FILM TRANSISTOR AND METHOD

FIELD OF THE INVENTION

This invention generally relates to flexible thin film transistors and more specifically to a high performance flexible substrate thin film transistor.

BACKGROUND OF THE INVENTION

There is presently enormous interest in flexible substrate thin film transistors. However, most organic thin film transistors are very low performance devices, i.e. the mobility of the organic material is very low. The FIGURE of merit in TFTs is defined by $\mu V/L^2$ where $\mu$ is the mobility, V is the voltage and L is the gate length. Further, it is generally desirable to use a low source voltage (10 volts or less) in operation of the device. Thus, the mobility must be relatively high for high performance devices. One problem with inorganic materials grown at low temperature can be the mobility, e.g. the mobility of amorphous silicon is in a range of 0.1 to 1 $cm^2/V.sec$.

Attempts to produce inorganic thin film transistors compatible with flexible substrates have not been very successful because most of the inorganic material used requires relatively high temperature processing steps. Inorganic semiconductor materials often suffer from Fermi level pinning at the interface with inorganic dielectric material due to reaction between the inorganic materials at the interface. Also, inorganic dielectrics are polar material and have been shown to give rise to gap states formation and interface scattering in the semiconductor channel, resulting in lower channel mobility. Thus, while the mobility may be high in the material itself, the effective mobility is reduced substantially within a device because of interaction between materials. For example, in order to place a gate dielectric on a semiconductor the semiconductor must generally be passivated so that the two materials do not interact at the interface to produce the undesirable interface states. The standard passivation techniques (generally including annealing) require relatively high temperatures, e.g. >200° C., which is too high for flexible plastic substrates. In addition, inorganic dielectrics are not truly compatible with flexible substrate processing and their long-term mechanical flexibility is questionable.

For gate dielectric materials, the FIGURE of merit is C/J where C is the capacitance per unit area and J is the leakage per unit area. With reference to layers of inorganic dielectric material, besides the heat required in the process, a typical deposition process, such as sputtering for example, leaves pinholes throughout the material. These pinholes result in gate leakage current which can greatly reduce the operation of the device. In the prior art, to overcome this leakage the dielectric layer is made substantially thicker. Thus, while it is desirable to make the gate dielectric layer as thin as possible to reduce operating voltages and increase gate capacitance, the thickness of gate dielectric material must be increased to reduce leakage to a manageable level. The FIGURE of merit is, therefore, limited in any material deposited by typical deposition methods.

Also, in many applications it is desirable to incorporate non-volatile memory into the device. In the past this was accomplished by using inorganic ferroelectric material. However, this inorganic ferroelectric material can only be deposited at high temperatures and is not compatible with flexible substrates.

It would be highly advantageous, therefore, to remedy the foregoing and other deficiencies inherent in the prior art.

Accordingly, it is an object of the present invention to provide new and improved high performance thin film transistors compatible with flexible substrates.

It is another object of the present invention to provide new and improved high performance thin film transistors with memory and compatible with flexible substrates.

It is another object of the present invention to provide new and improved high performance thin film transistors compatible with flexible substrates with thinner gate dielectric and less gate leakage.

It is another object of the present invention to provide a method of fabricating high performance thin film transistors compatible with flexible substrates with thinner gate dielectric and less gate leakage.

SUMMARY OF THE INVENTION

Briefly, to achieve the desired objects of the instant invention in accordance with a preferred embodiment thereof, provided is a high performance thin film transistor compatible with a flexible substrate including a layer of metal oxide semiconductor material and a layer of organic gate dielectric material deposited on the metal oxide semiconductor material to form an interface between the layer of metal oxide semiconductor material and the layer of organic gate dielectric material. In the preferred embodiment the layer of organic gate dielectric material includes a polymer dielectric and a self-assembled monolayer of organic molecules.

The desired objects of the instant invention and others are further achieved in a method of fabricating a high performance thin film transistor including the steps of providing a flexible substrate, depositing a layer of metal oxide semiconductor material on the flexible substrate, the metal oxide semiconductor material having a high carrier mobility, and depositing a layer of self-assembled organic gate dielectric material on the metal oxide semiconductor material to form an interface between the layer of metal oxide semiconductor material and the layer of organic gate dielectric material.

The desired objects of the instant invention and others are further achieved in a method of fabricating wherein the step of depositing the layer of self-assembled organic gate dielectric material includes a step of assembling molecules of the organic gate dielectric material one molecular layer at a time.

Also, interface states at the interface can be further reduced by positioning a layer of self-assembled molecules between the layer of metal oxide semiconductor material and the layer of organic gate dielectric material. In this embodiment each self-assembled molecule has an inorganic moiety and an organic moiety, and the layer of self-assembled molecules is assembled with the inorganic moiety coupled to the metal oxide semiconductor material and the organic moiety coupled to the organic gate dielectric material.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the single drawing which illustrates a thin film transistor compatible with flexible substrates in accordance with the present invention.

DETAILED DESCRIPTION OF A PREFERRED EMBODIMENT

Turning now to the drawing, a thin film transistor (TFT) 10 in accordance with the present invention is illustrated. In this embodiment, TFT 10 is positioned on a substrate 12 that is a flexible substrate but may be any other convenient material. A layer 14 of semiconductor material is positioned on substrate 12. Layer 14 is formed of a metal oxide that has well known semiconductor traits the primary one of which is very high mobility for carriers (i.e. electrons or holes). Typical metal oxides that can be used as semiconductors include ZnO, InO, InZnO, and InGaZnO. Further, all of these metal oxides are transparent and can be deposited at low temperatures and in sufficiently thin layers to be relatively flexible. Metal oxide thin film transistors are attractive for device applications because of their transparency and very high mobility even when they are deposited at room temperatures.

A thin layer 16 of organic dielectric material is deposited on semiconductor layer 14 by any convenient method. In the preferred embodiment the organic dielectric material is a polymer. One substantial advantage of using a polymer dielectric is that polymer dielectrics are non-polar so that they do not produce gap states formation and interface scattering in the semiconductor channel. Also, the inorganic/organic interface, designated 20 in the FIGURE, is a better interface free of the reaction and/or Fermi level pinning. Further, the polymer dielectric is more flexible, whereas the inorganic semiconductor layer and inorganic dielectric layer are less flexible and can eventually lead to device failure. Typical examples of organic gate dielectric material that can be used include polyvinyl phenol (PVP) or polyimide.

While any of a large variety of organic dielectrics will provide substantial improvement in operation, in the preferred embodiment a self-assembled monolayer of polymer is used as gate dielectric layer 16. Typical polymers that serve this purpose include $SiCl_3(CH_2)_{21}CH_3$ or $SiCl_3(CH_2)_{12}CHCH_2$. Here it must be noted that these molecules can be assembled layer by layer (i.e. self-assembled) without pinholes similar to atomic layer epitaxy. In this type of material a first layer is deposited and disperses into a single layer of molecules that not only adhere to the supporting layer (in this case semiconductor layer 14) but also to adjoining molecules so that no pinholes exist therebetween. The next layer is then added and the same result is achieved. In this fashion a very thin gate dielectric layer can be produced and, because it has no pinholes, will not result in high gate leakage. As explained above, the thinner the gate dielectric layer the higher the gate capacitance. Thus, the FIGURE of merit in these gate dielectric materials is very high. Another feature in the assembly of the organic gate dielectric layer that further improves the interface properties, incorporates a layer of self-assembled molecules each including an inorganic moiety and an organic moiety positioned between the metal oxide semiconductor and the organic gate dielectric. In this embodiment, the first layer of molecules positioned on the organic gate dielectric includes self-assembled molecules such as phosphonate-linked anthrancene or Hexamethyldidilizane (HMDS). The phosphonate (or hydroxyl) moiety is coupled to the metal oxide and when a layer of organic gate dielectric material is deposited on top, the organic moiety is coupled to the organic gate dielectric. In this way, the interface states (if any occur) can be reduced.

In many applications it is desirable to incorporate memory into the semiconductor devices, traditionally this is non-volatile memory and includes ferroelectric material deposited as or in addition to the gate dielectric at relatively high temperatures. The polarization state of the ferroelectric material can be changed between either of two states by the application of an electric field with the two states providing a binary option in the well known manner. The inorganic ferroelectric material, because it is deposited at high temperatures and is inflexible, is not compatible with flexible substrates.

In a preferred embodiment of non-volatile memory in the present device, an organic ferroelectric material such as poly (vinylidene fluoride and trifluoroethylene) P(VDF/TrFE) is synthesized and used in or as a component of the gate dielectric. The organic ferroelectric material can be synthesized and used at low temperatures and is compatible with flexible substrates.

In one specific embodiment, a high performance thin film transistor is provided with a compound layer of organic gate dielectric material positioned on a layer of metal oxide semiconductor material. The compound layer includes a first layer of self-assembled organic gate dielectric material and a second layer of gate dielectric material. Further, a monolayer of self-assembled organic gate dielectric material having an inorganic moiety and an organic moiety is positioned between the layer of metal oxide semiconductor material and the layer of self-assembled organic gate dielectric material with the inorganic moiety coupled to the metal oxide semiconductor material and the organic moiety coupled to the self-assembled organic gate dielectric material. The monolayer of self-assembled organic gate dielectric material may be included in the first layer of self-assembled organic gate dielectric material or it may be in addition to the first layer. The second layer of gate dielectric material may have some special qualities as, for example, it may include ferroelectric material to form a non-volatile memory.

Thus, new and improved high performance thin film transistors compatible with flexible substrates have been disclosed. Also, the new and improved high performance thin film transistors have a high FIGURE of merit because they can be manufactured with thinner gate dielectric and less gate leakage. Further, the new and improved high performance thin film transistors can be manufactured with nonvolatile memory and still be compatible with flexible substrates.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A high performance thin film transistor compatible with a flexible substrate comprising a layer of metal oxide semiconductor material and a layer of organic gate dielectric material deposited on the metal oxide semiconductor material to form an interface between the layer of metal oxide semiconductor material and the layer of organic gate dielectric material, the layer of organic gate dielectric material including a self-assembled monolayer of organic molecules and the self-assembled monolayer of organic molecules including at least one of $SiCl_3 (CH_2)_{21} CH_3$ or $SiCl_3 (CH_2)_{12} CHCH_2$.

2. A high performance thin film transistor as claimed in claim 1 wherein the layer of metal oxide semiconductor material includes at least one of ZnO, InZnO, InO, and InGaZnO.

3. A high performance thin film transistor as claimed in claim 1 wherein the layer of organic gate dielectric material includes one of polyvinyl phenol (PVP) and polyimide.

4. A high performance thin film transistor compatible with a flexible substrate comprising a layer of metal oxide semiconductor material and a layer of organic gate dielectric material deposited on the metal oxide semiconductor material to form an interface between the layer of metal oxide semiconductor material and the layer of organic gate dielectric material, the layer of organic gate dielectric material including a self-assembled monolayer of organic molecules, each self-assembled molecule having an inorganic moiety and an organic moiety, the layer of self-assembled molecules being positioned between the layer of metal oxide semiconductor material and the layer of organic gate dielectric material with the inorganic moiety being coupled to the metal oxide semiconductor material and the organic moiety being coupled to the organic gate dielectric material.

5. A high performance thin film transistor as claimed in claim 4 wherein the layer of self-assembled molecules includes a layer of one of a phosphonate-linked anthrancene and Hexamethyldidilizane (HMDS).

6. A high performance thin film transistor as claimed in claim 4 wherein the layer of organic gate dielectric material includes an organic ferroelectric material forming a non-volatile memory.

7. A high performance thin film transistor as claimed in claim 4 wherein the organic ferroelectric material forming the non-volatile memory includes poly(vinylidene fluoride and trifluoroethylene) P(VDF/TrFE).

8. A high performance thin film transistor as claimed in claim 4 wherein the layer of organic gate dielectric material is a compound layer and includes a first layer of self-assembled organic gate dielectric material and a second layer of gate dielectric material.

9. A high performance thin film transistor as claimed in claim 8 wherein the second layer of gate dielectric material in the compound layer includes an organic ferroelectric material forming a non-volatile memory.

10. A method of fabricating a high performance thin film transistor comprising the steps of:
 providing a flexible substrate;
 depositing a layer of metal oxide semiconductor material on the flexible substrate, the metal oxide semiconductor material having a high carrier mobility;
 depositing a layer of self-assembled organic gate dielectric material on the metal oxide semiconductor material and forming an interface between the layer of metal oxide semiconductor material and the layer of organic gate dielectric material, the forming including positioning a layer of self-assembled molecules between the layer of metal oxide semiconductor material and the layer of self-assembled organic gate dielectric material, each self-assembled molecule having an inorganic moiety and an organic moiety, and the layer of self-assembled molecules being assembled with the inorganic moiety coupled to the metal oxide semiconductor material and the organic moiety coupled to the organic gate dielectric material.

11. A method as claimed in claim 10 wherein the step of depositing the layer of self-assembled organic gate dielectric material includes a step of assembling molecules of the organic gate dielectric material one molecular layer at a time.

12. A method as claimed in claim 10 wherein the step of depositing a layer of self-assembled organic gate dielectric material includes forming a non-volatile memory by depositing an organic ferroelectric material.

13. A method as claimed in claim 10 wherein the step of depositing the layer of metal oxide semiconductor material includes depositing at least one of ZnO, InO, InZnO, and InGaZnO.

* * * * *